United States Patent
Tong et al.

(10) Patent No.: US 12,317,522 B2
(45) Date of Patent: May 27, 2025

(54) THREE-DIMENSIONAL 1S1C MEMORY BASED ON RING CAPACITOR AND PREPARATION METHOD

(71) Applicant: HUAZHONG UNIVERSITY OF SCIENCE AND TECHNOLOGY, Hubei (CN)

(72) Inventors: Hao Tong, Hubei (CN); Binhao Wang, Hubei (CN); Shaojie Long, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/285,857

(22) PCT Filed: May 6, 2023

(86) PCT No.: PCT/CN2023/092494
§ 371 (c)(1),
(2) Date: Oct. 5, 2023

(87) PCT Pub. No.: WO2024/138992
PCT Pub. Date: Jul. 4, 2024

(65) Prior Publication Data
US 2025/0113505 A1    Apr. 3, 2025

(30) Foreign Application Priority Data
Dec. 27, 2022  (CN) .......................... 202211686527.5

(51) Int. Cl.
*H10D 1/68*       (2025.01)
*H10B 41/27*     (2023.01)
(Continued)

(52) U.S. Cl.
CPC ............. *H10D 1/716* (2025.01); *H10B 41/27* (2023.02); *H10B 41/30* (2023.02); *H10B 41/40* (2023.02)

(58) Field of Classification Search
CPC ........ H10D 1/716; H10B 41/27; H10B 41/30; H10B 41/40; H10B 12/038; H10B 12/34; H10B 12/373
See application file for complete search history.

(56) References Cited

U.S. PATENT DOCUMENTS 11,233,060 B2 * 1/2022 Lee ..................... H10B 12/09

FOREIGN PATENT DOCUMENTS

| CN | 112216696 | 1/2021 |
| CN | 113366637 | 9/2021 |

(Continued)

OTHER PUBLICATIONS

"International Search Report (Form PCT/ISA/210) of PCT/CN2023/092494," mailed on Sep. 1, 2023, pp. 1-3.
(Continued)

*Primary Examiner* — Allison Bernstein
(74) *Attorney, Agent, or Firm* — JCIPRNET

(57) ABSTRACT

The invention discloses a three-dimensional 1S1C memory based on a ring capacitor and a preparation method. The memory includes: a horizontal peripheral electrode layer including a first dielectric layer and a first metal electrode layer alternately stacked and grown on a substrate and provided with trenches penetrating in a vertical direction and holes penetrating in the vertical direction, a vertical functional layer, and a capacitive dielectric layer. An annular groove is disposed outside each hole. The annular groove surrounds the holes and vertically cuts off the peripheral electrode layer. The annular groove is evenly filled with a capacitive dielectric layer. A top of the second metal elec-
(Continued)

trode layer is extended to a surface of a topmost first dielectric layer to form a bit line electrode and is connected to a bit line. A region where the second metal electrode layer faces the first metal electrode layer forms a memory cell.

10 Claims, 3 Drawing Sheets

(51) Int. Cl.
  *H10B 41/30* (2023.01)
  *H10B 41/40* (2023.01)

(56) References Cited

FOREIGN PATENT DOCUMENTS

| | | |
|---|---|---|
| CN | 114937738 | 8/2022 |
| CN | 115116963 | 9/2022 |
| CN | 115377105 | 11/2022 |
| KR | 20190095138 | 8/2019 |

OTHER PUBLICATIONS

"Written Opinion of the International Searching Authority (Form PCT/ISA/237) of PCT/CN2023/092494," mailed on Sep. 1, 2023, pp. 1-3.

* cited by examiner

THREE-DIMENSIONAL 1S1C MEMORY BASED ON RING CAPACITOR AND PREPARATION METHOD

CROSS-REFERENCE TO RELATED APPLICATION

This application is a 371 of international application of PCT application serial no. PCT/CN2023/092494, filed on May 6, 2023, which claims the priority benefit of China application no. 202211686527.5, filed on Dec. 27, 2022. The entirety of each of the above-mentioned patent application is hereby incorporated by reference herein and made a part of this specification.

FIELD OF THE INVENTION

The invention belongs to the field of memory techniques, and more specifically, relates to a three-dimensional 1S1C memory based on a ring capacitor and a preparation method.

DESCRIPTION OF RELATED ART

It is difficult for DRAM to realize three-dimensional stacking to increase memory density, which is one of the bottlenecks of modern computer performance. At present, there is related technique that adopts a two-terminal gate device to replace MOS control to charge and discharge capacitors. In this way, data memory function (1S1C memory) may be realized without significantly reducing memory working speed, and there is also the potential of three-dimensional stacking.

There are currently two main types of 1S1C memory three-dimensional stacking solutions proposed by related techniques: (1) a crossbar structure is formed and memory cells are disposed at the intersection of word lines and bit lines. This three-dimensional integration method requires the production of gate tube units and capacitor units when preparing each layer of memory cells. The process steps are very cumbersome, and the overlay accuracy requirements of photolithography are higher. When preparing multi-layer memory cells, the process flow is too long. (2) A structure similar to floating gate 3D-NAND is adopted, and this structure is easier to implement multi-layer memory stacking and only needs to deposit the gate tube film once. However, the preparation process of the capacitors thereof is more complicated, and a plurality of independent horizontal capacitors need to be prepared in deep holes, thus requiring a plurality of etching processes, and resulting in reduced yield and becoming one of the bottlenecks restricting this technical route.

SUMMARY OF THE INVENTION

In view of the shortcomings of the prior art, an object of the invention is to propose a three-dimensional 1S1C memory based on a ring capacitor and a preparation method, aiming to solve the issue of complex preparation processes of 3D-1S1C memory capacitors with a 3D-NAND-like structure.

The invention provides a three-dimensional 1S1C memory based on a ring capacitor, including: a horizontal peripheral electrode layer, a vertical functional layer, and a capacitive dielectric layer: the peripheral electrode layer includes a first dielectric layer and a first metal electrode layer that are alternately stacked and grown on a substrate, and a topmost layer is the first dielectric layer; the peripheral electrode layer is provided with a number of trenches penetrating in a vertical direction, the trenches are parallel to each other, and a bottom of the trenches is located in the substrate, the first metal electrode layer in each layer is divided into several independent strip electrodes by the trenches, and the strip electrodes are the word lines of the memory; the peripheral electrode layer is provided with a number of holes penetrating in the vertical direction, the holes are arranged in an array according to a certain pattern, and a bottom of the holes is extended to at least a bottom-most first dielectric layer; an inner wall of the holes is evenly covered with a gate tube functional layer, a second metal electrode layer is formed at a surface of the gate tube functional layer, a thickness of a bottom of the second metal electrode layer and the gate functional layer in the vertical direction is smaller than that of the bottom-most first metal electrode layer, an annular groove is disposed outside of each of the holes, the holes are located at a center position of the annular groove, the annular groove surrounds the holes and vertically cuts off the peripheral electrode layer, a bottom of the annular groove is extended at least to the bottom-most first dielectric layer, the annular groove is evenly filled with the capacitive dielectric layer, a top of the second metal electrode layer is extended to a surface of a topmost first dielectric layer to form a bit line electrode and is connected to a bit line, and a region where the second metal electrode layer faces the first metal electrode layer forms a memory cell.

Furthermore, the first dielectric layer and the first metal electrode layer that are alternately stacked are periodically repeated in the vertical direction as needed, and a number of repetitions is the same as a number of memory cell layers needed for the three-dimensional 1S1C memory.

Furthermore, all memory cells in a same vertical direction share a same bit line electrode, and all memory cells in a same strip electrode share a same word line electrode.

Furthermore, a thickness of the first metal electrode layer and a size of the holes satisfy a following relationship: $h*w<1\ um^2$, wherein h is the thickness of the first metal electrode layer, and w is a circumference of the holes.

Furthermore, the holes are arranged in a rectangular or parallelogram arrangement.

Furthermore, a region where the gate tube functional layer is in contact with the first metal electrode layer constitutes the gate tube unit, wherein the second metal electrode layer is an upper electrode of the gate tube unit, the region where the first metal electrode layer is in contact with the gate tube functional layer constitutes a lower electrode of the gate tube unit, the first metal electrode layer is cut vertically by the annular grooves, leaving two electrodes facing each other in a horizontal direction that form a capacitor with the filled capacitive dielectric layer, electrodes sandwiched between the holes and the annular grooves are the lower electrode of the gate tube unit and an upper electrode of the capacitor used to connect the gate tube unit and the capacitor to form the memory cell.

Furthermore, a width of the annular grooves and a dielectric constant of the capacitive dielectric layer jointly determine a capacitance value of a capacitor, and a width of the grooves is designed according to the capacitance value needed by the memory cells.

The invention also provides a preparation method based on the three-dimensional 1S1C memory, including the following steps:
S1: forming the peripheral electrode layer on the substrate of a memory cell region, comprising alternately growing the first dielectric layer and the first metal electrode layer, and a number of layers of the first metal electrode layer grown is the same as a number of layers of memory cells needed for the three-dimensional 1S1C memory;

S2: etching to form a number of annular grooves penetrating in the vertical direction, the bottom of the annular grooves is extended at least to the bottom-most first dielectric layer, and the capacitive dielectric layer is completely filled in the annular grooves, and the annular grooves are arranged in an array according to a certain pattern;

S3: etching to form the holes penetrating in the vertical direction in a region surrounded by each annular groove, the holes are located at a center of the annular grooves, and the bottom of the holes is extended to at least the bottom-most first dielectric layer;

S4: forming the gate tube layer and the second metal electrode layer on a sidewall and the bottom of the holes in sequence, and the second metal electrode layer is extended to the surface of the topmost first dielectric layer to form the bit line electrode and is connected to the bit line;

S5: etching to form a number of trenches penetrating in the vertical direction, the trenches are parallel to each other, and the bottom of the trenches is located in the substrate, and the trenches divide the peripheral electrode layer into several independent strip-shaped portions.

Furthermore, a material of the capacitive dielectric layer includes $SiO_2$ or a high-k material.

Furthermore, the high-k material includes a nitride, a metal oxide, an oxynitride, or a perovskite phase oxide; the nitride is SiN, AlN, TiN; the metal oxide is a subgroup and lanthanide metal element oxide, such as MgO, $Al_2O_3$, $Ta_2O_5$, $TiO_2$; the nitride is SiON or HfSiON; the perovskite phase oxide is $PbZr_xTi_{1-x}O_3$ (PZT) or $Ba_xSr_{1-x}TiO_3$ (BST).

Via the above technical solutions conceived by the invention, compared with the prior art, the beneficial effects of the invention are:

(1) In the invention, the gate layer and the capacitor are separated for preparation, and an annular capacitor is introduced and sleeved outside the hole-shaped grooves of the gate layer to form a 1S1C memory, wherein the capacitor preparation process only needs one longitudinal etching of the annular grooves, which may be completed using conventional physical etching methods, thus reducing the number of etching times and the etching process is also simpler. Since the number of etchings is reduced when preparing the capacitor, and only one etching and one deposition of the capacitive dielectric layer are needed to complete the preparation of all capacitor units, the yield of the capacitor preparation is improved.

(2) In the invention, the area of the upper and lower plates of all capacitor units is the surface area in contact between the annular grooves and the word line electrode layer, and the thickness of the capacitive dielectric layer is the width of the annular grooves, so the consistency of the prepared capacitors is good. Since the capacitance value of the capacitor mainly depends on the area of the opposite plates, the distance between the plates, and the dielectric layer; the structure proposed by the invention makes the area of the opposite plates and the distance between the plates of all capacitor units equal, so the memory lastly prepared has better consistency.

(3) When the three-dimensional 1S1C memory needs to adopt capacitor units with different capacitance values (when the capacitance value of the capacitor unit needs to be changed), the plate spacing may be changed by adjusting the width of the annular grooves, thereby achieving the object of regulating capacitance value; therefore, capacitors with different capacitance values may be prepared simply by changing the width of the annular grooves.

Figure 1:
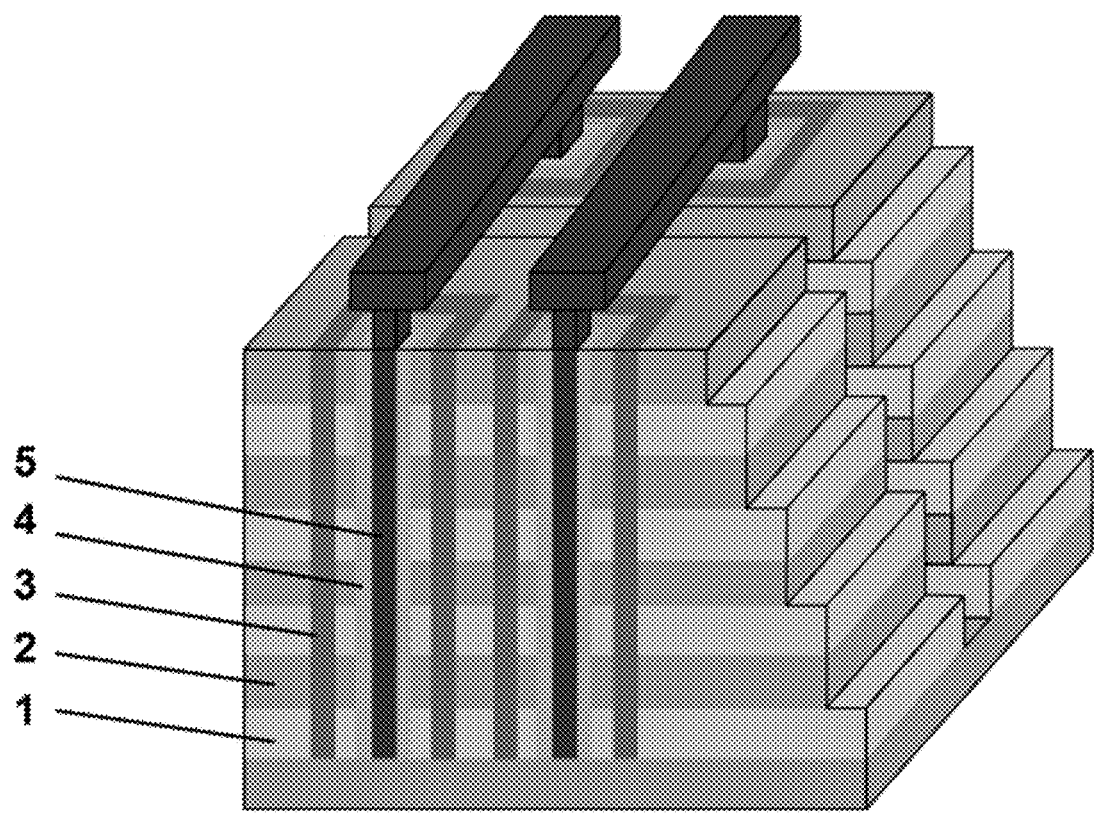
FIG. 1 is a schematic structural diagram of a three-dimensional 1S1C memory based on a ring capacitor provided by an embodiment of the invention.

In particular, 1 is the first metal electrode layer, 2 is the first dielectric layer, 3 is the annular groove completely filled with the capacitive dielectric layer, 4 is the gate tube functional layer, and 5 is the second metal electrode layer.

DESCRIPTION OF THE EMBODIMENTS

In order to make the object, technical solutions, and advantages of the invention clearer, the invention will be further described in detail below with reference to the accompanying drawings and embodiments. It should be understood that the specific embodiments described here are only used to explain the invention and are not intended to limit the invention.

In the 3D-1S1C memory structure of the 3D-NAND-like structure, the memory cells are all disposed in the horizontal direction. That is, the layers of film that make up a single memory unit are vertically shaped and in contact with each other in the horizontal direction. In order to separate the capacitors between each memory cell, the horizontal electrode layer needs to be etched laterally inwards, and the capacitor is formed in the annular grooves formed by lateral etching. The preparation process is extremely complicated and the yield is reduced. This invention innovatively prepares the capacitor and the gate layer independently. The capacitor adopts a one-time molding method. The preparation process is simple, the process tolerance is higher, and the yield rate is significantly improved.

The invention provides a three-dimensional 1S1C memory based on a vertical electrode. The three-dimensional 1S1C memory includes: a horizontal peripheral electrode layer, a vertical functional layer, and a capacitive dielectric layer:

The peripheral electrode layer includes a bottom-most silicon dioxide substrate, with metal electrode layers and silicon dioxide insulating layers stacked alternately from bottom to top, and the topmost layer is a silicon dioxide top layer;

The functional layers from the inside to the outside are a bit line electrode layer and a gate tube material functional layer;

The capacitive dielectric layer surrounds the vertical functional layer and cuts off the peripheral electrode layer. The metal electrode between the vertical functional layer and the capacitive dielectric layer is the top electrode of the memory cell capacitor;

The vertical functional layer and the capacitive dielectric layer in the functional layer are perpendicular to the peripheral electrode layer and extended to the surface of the three-dimensional 1S1C memory structure.

In particular, the alternately stacked bottom-up metal electrodes and silicon dioxide insulating layers are periodically repeated in the vertical direction as needed, and the number of repetitions is the same as the number of memory cell layers needed for the three-dimensional 1S1C memory. Periodic repetition is determined by structure and function. To achieve multi-layer memory in this structure, it is necessary to repeat the metal electrodes and silicon dioxide insulating layers many times; the number of layers of memory that needs to be prepared determines the number of times the layer needs to be repeated.

In particular, all memory cells in the same vertical direction share the same bit line electrode, and all memory cells in the same layer in the same horizontal direction share the same word line electrode. Different rows are separated in the three-dimensional 1S1C memory, and the bit line electrodes of the same column are extended to the surface and connected together by column bit lines. The word line electrodes of each memory cell are all arranged in the horizontal direction, and the capacitor layer in each memory cell is a ring-shaped region, and the gate tube layer in each memory cell is a functional layer portion corresponding to the capacitor layer.

The invention also provides a preparation method based on the three-dimensional 1S1C memory, including the following steps:

(1) Alternately grow metal electrode materials and $SiO_2$ insulating layers on a silicon substrate using magnetron sputtering until the target number of layers is reached;

(2) Etch to form a plurality of annular through holes until the bottom metal electrode is completely etched, and grow a capacitive dielectric layer in the through holes;

In an embodiment of the invention, the capacitor is prepared by etching annular grooves and completely filling the grooves with a dielectric layer, thus improving the capacitor preparation process and making the capacitor preparation process simpler, and since the plate spacing of each capacitor unit prepared by etching is more consistent, the uniformity of the capacitance value of each capacitor unit is better guaranteed.

(3) Overlay the through holes of the vertical functional layer at a center of the annular region until the metal electrode at the bottom layer is completely etched, and grow the gate tube material functional layer and the bit line electrode layer sequentially in the through holes;

In an embodiment of the invention, by overlaying the vertical functional layer through holes at the center of the annular region, the gate tube unit is completely wrapped by the annular capacitor unit to form the 1S1C memory unit.

(4) Grow a column bit line electrode;

(5) Etch steps to expose all word line electrodes.

In particular, the columnar hole structure is a square hole structure or a circular hole structure. The sidewalls formed by the circular hole or square hole structure are smoother, thus facilitating the deposition of thin films on the sidewalls.

Further, preferably, the capacitive dielectric layer is a circular ring or a square ring.

In particular, when magnetron sputtering is used to deposit the gate tube layer and the bit line electrode layer, in order to prevent excessive energy from damaging the photoresist, the magnetron sputtering needs to be done for a period of time and stopped for a period of time. If the sputtering time is too long, the photoresist is denatured and may not be peeled off, resulting in sample preparation failure.

In order to further illustrate the three-dimensional 1S1C memory based on a ring capacitor and the preparation method provided by the embodiments of the invention, the details are as follows with reference to the accompanying drawings and specific examples:

FIG. 1 is a structural diagram of a three-dimensional 1S1C memory based on a ring capacitor provided by an embodiment of the invention. The bottom layer is a layer of silicon dioxide. On the bottom layer of silicon dioxide are alternately grown metal word line electrode layers and silicon dioxide insulation layers. The number of layers of the three-dimensional 1S1C memory needed determines the number of repeated growths needed. There are a plurality of memory cells in each word line electrode layer. These memory cells are composed of memory capacitors and gate tube functional layers, wherein the memory capacitors have a word line metal electrode as the bottom electrode of the capacitor, a dielectric layer completely filled in the annular grooves as the dielectric layer of the capacitors, and a word line metal electrode inside the annular grooves as the metal top electrode; wherein the gate tube functional layer is composed of the gate tube functional layer material in the vertical through holes and the bit line electrode layer material. Different layers of memory cells are separated by horizontal silicon dioxide insulating layers. The bit line electrodes are extended to the surface of the device, and the bit lines of the memory cells of the same column are connected together by the column bit lines.

Figure 2:
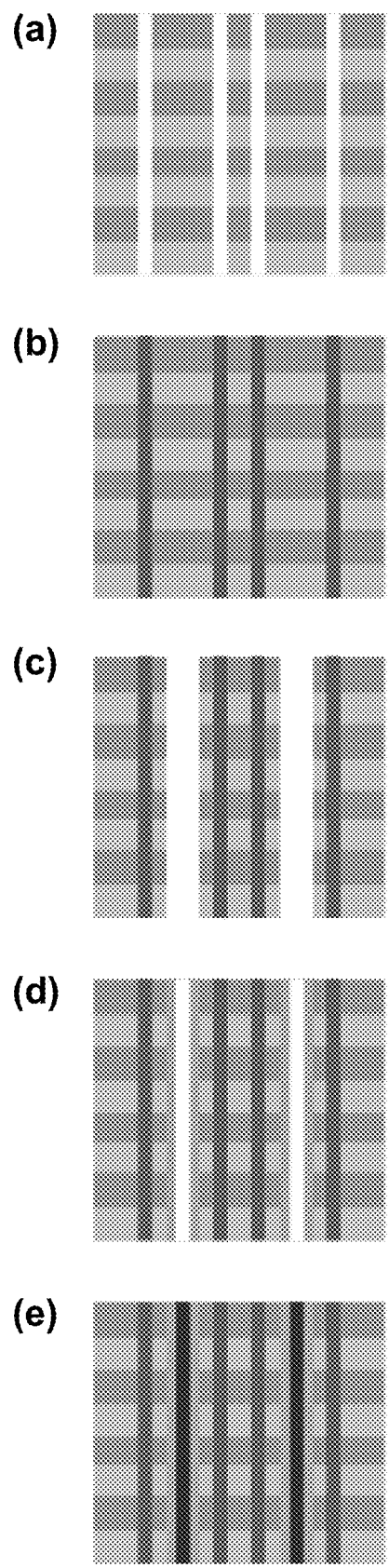
FIG. 2 is a process flowchart of a preparation method of a three-dimensional 1S1C memory based on a ring capacitor provided by an embodiment of the invention.
Figure 3:
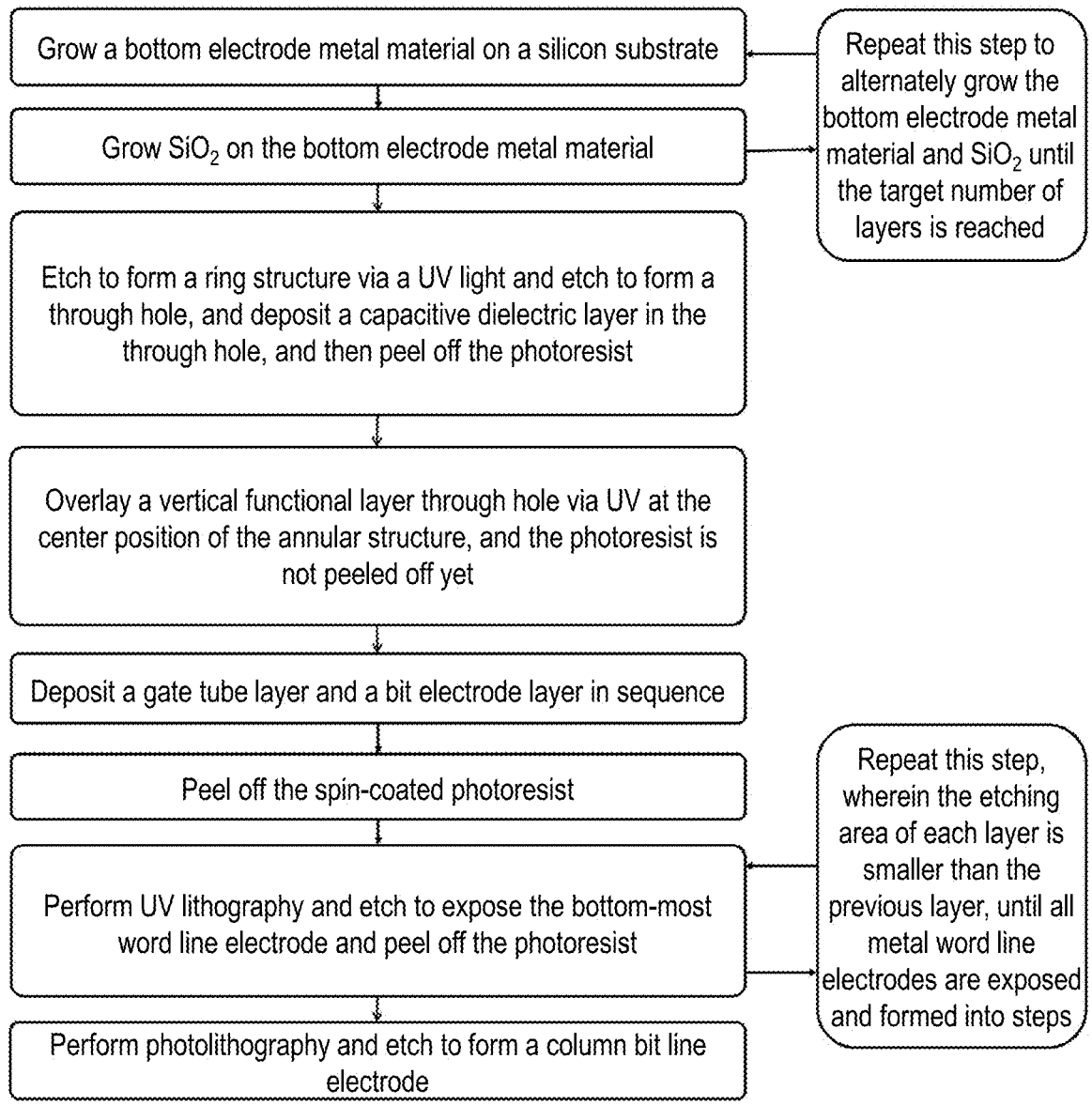
FIG. 3 is an implementation flowchart of a preparation method of a three-dimensional 1S1C memory based on a ring capacitor provided by an embodiment of the invention.

As shown in FIG. 2 and FIG. 3, an embodiment of the invention provides a preparation method of a three-dimensional 1S1C memory based on a ring capacitor, specifically including the following steps:

As shown in (a) of FIG. 2, first, a metal electrode material is grown on the substrate, and an insulating layer is grown on the prepared metal electrode. Then, the alternate growth of the metal electrode material and the insulating layer is repeated until the target number of layers is reached. The deposition process includes, for example, LPCVD, PECVD, HDPCVD, UHVCVD, MOCVD, MBE, ALD, evaporation, sputtering, and the like. In order to be compatible with existing IC manufacturing processes, the substrate is preferably a substrate containing a silicon material, such as Si, $SiO_2$, etc. The material of the insulating layer stack structure includes at least one of the following insulating media, such as silicon oxide, silicon nitride, silicon oxynitride, amorphous carbon, diamond-like amorphous carbon (DLC), germanium oxide, aluminum oxide, etc. and a combination thereof. In order to be compatible with the existing IC manufacturing process, $SiO_2$ is preferably selected as the dielectric of the insulating layer.

Subsequently, an annular hole structure is formed by etching on the prepared chip using UV light, and through holes are formed by etching. Etching needs to adopt an anisotropic etching process, such as plasma dry etching or RIE using fluorocarbon (CxHyFz constitutes fluorinated hydrocarbon) as the etching gas, to etch alternating insulating layers and metal layers vertically downward until the bottom-most insulating dielectric layer is etched. As shown in (b) of FIG. 2, in the next step, the dielectric layer material is grown on the prepared sheet as the dielectric layer of the capacitors. Since the depth of the through holes is deeper, deposition may be performed using LPCVD, PECVD, HDPCVD, UHVCVD, MOCVD, and other processes. Metal element oxide, nitride, perovskite phase oxide, etc. may be used as the dielectric layer high-k material. In order to be compatible with the existing IC manufacturing process, $SiO_2$ may be selected as the dielectric of the insulating layer. The photoresist is peeled off after deposition is completed.

As shown in (c) of FIG. 2, next, a columnar hole structure is formed by overlay via UV at the center of the annular structure of the prepared piece, and through holes are formed by etching. When etching, anisotropic etching process is also selected and etching is performed until the bottom-most insulating dielectric layer is reached, and then the photoresist is peeled off. Then, overlay is performed on the columnar hole structure via UV, and only the photoresist is developed, and the photoresist is not peeled off yet. As shown in (d) of FIG. 2, the gate tube material layer and the bit line electrode layer are sequentially deposited in the through holes. The functional layer is grown by magnetron sputtering. The functional layer needs to adopt a material having gate tube properties, such as OTS, CBTS, MIT gate tube materials, etc. As shown in (e) of FIG. 2, the bit line electrode is also deposited in the through holes using magnetron sputtering, and the prepared electrode needs to be extended to the device surface.

After the functional layer is finished preparing, the spin-coated photoresist is peeled off; subsequently, UV lithography is performed to form a bit line electrode structure in the same column by etching, and only the photoresist is developed, and the bit line electrode metal layer is deposited using magnetron sputtering, and then the spin-coated photoresist is peeled off; column bit line electrodes as shown in FIG. 1 are prepared.

Lastly, UV lithography is performed and grooves are formed by etching to expose the uppermost word line electrode metal; then, this step is repeated, and the number of repetitions is the same as the number of repetitions of the word line electrode layer and $SiO_2$. Each etching depth is deeper than the previous one, and the groove position is closer to the edge of the upper electrode than the previous one. The bottom electrode metal of all layers is exposed in turn; a stepped word line electrode as shown in FIG. 1 is prepared.

In the prior art of three-dimensional 1S1C memory preparation process, to prepare each layer of memory cells, it is necessary to form a hole-like structure by overlay and etching and fill the hole-like structure with a functional layer (memory capacitor unit and gate tube unit). In the 1S1C memory preparation method provided by the invention, after all word line electrode layers and isolation layers are deposited, photolithography and etching are performed only once on the annular structure and the annular structure is filled with the capacitive dielectric layer. Then, vertical functional layer through holes are overlaid and etched at the center of the annular structure. The gate tube functional layer material and the bit line electrode layer material are filled in the through holes to significantly simplify the complexity of the preparation process and improve the yield of the three-dimensional 1S1C memory preparation.

After the above step, the preparation of three layers of three-dimensional 1S1C memory based on a vertical electrode may be completed, which has the potential to achieve higher memory density and minimizes issues such as unsatisfactory accuracy and excessive cost caused by multiple overlays.

In the three-dimensional 1S1C memory structure obtained by the above preparation method, the memory capacitor unit and the gate tube material only need to be deposited once, thus reducing the process complexity of the three-dimensional 1S1C memory. At the same time, the number of memory cell layers in the three-dimensional 1S1C memory may be increased by simply increasing the number of word line electrode layers and isolation layers.

Those skilled in the art may easily understand that the above descriptions are only preferred embodiments of the invention and are not intended to limit the invention. Any modifications, equivalent substitutions, and improvements and the like made within the spirit and principles of the invention shall be included in the protection scope of the invention.

What is claimed is:

1. A three-dimensional 1S1C memory based on a ring capacitor, comprising: a horizontal peripheral electrode layer, a vertical functional layer, and a capacitive dielectric layer:

the peripheral electrode layer comprises a first dielectric layer and a first metal electrode layer alternately stacked and grown on a substrate, and a topmost layer is the first dielectric layer;

the peripheral electrode layer is provided with a number of trenches penetrating in a vertical direction, the trenches are parallel to each other, and a bottom of the trenches is located in the substrate, the first metal electrode layer in each layer is divided into several independent strip electrodes by the trenches, and the strip electrodes are word lines of the memory;

the peripheral electrode layer is provided with a number of holes penetrating in the vertical direction, the holes are arranged in an array according to a certain rule, and a bottom of the holes is extended to at least a bottom-most first dielectric layer;

an inner wall of the holes is evenly covered with a gate tube functional layer, a second metal electrode layer is formed at a surface of the gate tube functional layer, an annular groove is disposed outside of each of the hole, the holes are located at a center position of the annular groove, the annular groove surrounds the holes and vertically cuts off the peripheral electrode layer, a bottom of the annular groove is extended at least to the bottom-most first dielectric layer, the annular groove is evenly filled with the capacitive dielectric layer, a top of the second metal electrode layer is extended to a surface of a topmost first dielectric layer to form a bit line electrode and is connected to a bit line, and a region where the second metal electrode layer faces the first metal electrode layer forms a memory cell.

2. The three-dimensional 1S1C memory of claim 1, wherein the first dielectric layer and the first metal electrode layer that are alternately stacked are periodically repeated in the vertical direction as needed, and a number of repetitions is the same as a number of memory cell layers needed for the three-dimensional 1S1C memory.

3. The three-dimensional 1S1C memory of claim 1, wherein all memory cells in a same vertical direction share a same bit line electrode, and all memory cells in a same strip electrode share a same word line electrode.

4. The three-dimensional 1S1C memory of claim 1, wherein a thickness of the first metal electrode layer and a size of the holes satisfy a following relationship: $h*w<1$ $um^2$, wherein h is the thickness of the first metal electrode layer, and w is a circumference of the holes.

5. The three-dimensional 1S1C memory of claim 1, wherein the holes are arranged in a rectangle or a parallelogram.

6. The three-dimensional 1S1C memory of claim 1, wherein a region where the gate tube functional layer is in contact with the first metal electrode layer constitutes a gate tube unit, wherein the second metal electrode layer is an upper electrode of the gate tube unit, a region where the first metal electrode layer is in contact with the gate tube functional layer constitutes a lower electrode of the gate tube unit, the first metal electrode layer is vertically cut by the annular grooves, leaving two electrodes facing each other in a horizontal direction that form a capacitor with the filled capacitive dielectric layer, electrodes sandwiched between the holes and the annular grooves are the lower electrode of the gate tube unit and an upper electrode of the capacitor used to connect the gate tube unit and the capacitor to form the memory cell.

7. The three-dimensional 1S1C memory of claim 1, wherein a width of the annular grooves and a dielectric constant of the capacitive dielectric layer jointly determine a capacitance value of a capacitor, and a width of the grooves is designed according to a capacitance value needed by the memory cells.

8. A preparation method based on the three-dimensional 1S1C memory of claim 1, comprising the following steps:
S1: forming the peripheral electrode layer on the substrate of a memory cell region, comprising alternately growing the first dielectric layer and the first metal electrode layer, and a number of layers of the first metal electrode layer grown is the same as a number of layers of memory cells needed for the three-dimensional 1S1C memory;
S2: etching to form a number of annular grooves penetrating in the vertical direction, the bottom of the annular grooves is extended at least to the bottom-most first dielectric layer, and the capacitive dielectric layer is completely filled in the annular grooves, and the annular grooves are arranged in an array according to a certain pattern;
S3: etching to form the holes penetrating in the vertical direction in a region surrounded by each of the annular grooves, the holes are located at a center of the annular grooves, and the bottom of the holes is extended to at least the bottom-most first dielectric layer;
S4: forming the gate tube layer and the second metal electrode layer on a sidewall and the bottom of the holes in sequence, and the second metal electrode layer is extended to the surface of the topmost first dielectric layer to form the bit line electrode and is connected to the bit line;
S5: etching to form a number of trenches penetrating in the vertical direction, the trenches are parallel to each other, and the bottom of the trenches is located in the substrate, and the trenches divide the peripheral electrode layer into several independent strip-shaped portions.

9. The preparation method of claim 8, wherein a material of the capacitive dielectric layer comprises $SiO_2$ or a high-k material.

10. The preparation method of claim 9, wherein the high-k material comprises a nitride, a metal oxide, an oxynitride, or a perovskite phase oxide;
the nitride is SiN, AlN, TiN;
the metal oxide is a subgroup and lanthanide metal element oxide, such as MgO, $Al_2O_3$, $Ta_2O_5$, $TiO_2$, ZnO, $ZrO_2$, $HfO_2$, $CeO_2$, $Y_2O_3$, $La_2O_3$;
the oxynitride is SiON or HfSiON;
the perovskite phase oxide is $PbZr_xTi_{1-x}O_3$ (PZT) or $Ba_xSr_{1-x}TiO_3$ (BST).

* * * * *